United States Patent
Cao et al.

(10) Patent No.: US 10,634,744 B2
(45) Date of Patent: Apr. 28, 2020

(54) MAGNETIC RESONANCE IMAGING GRADIENT DRIVER SYSTEMS AND METHODS

(71) Applicant: GENERAL ELECTRIC COMPANY, Schenectady, NY (US)

(72) Inventors: Zhenen Cao, Beijing (CN); Tiezheng Chen, Beijing (CN); Jie Zhou, Beijing (CN); Tao Ma, Shanghai (CN); Margaret Wiza, New Berlin, WI (US); Jiabin Yao, Beijing (CN); Juan Sabate, Gansevoort, NY (US)

(73) Assignee: General Electric Company, Schenectady, NY (US)

( * ) Notice: Subject to any disclaimer, the term of this patent is extended or adjusted under 35 U.S.C. 154(b) by 245 days.

(21) Appl. No.: 15/708,574

(22) Filed: Sep. 19, 2017

(65) Prior Publication Data

US 2019/0086493 A1 Mar. 21, 2019

(51) Int. Cl.
*G01R 33/385* (2006.01)
*H03F 3/217* (2006.01)
(Continued)

(52) U.S. Cl.
CPC ......... *G01R 33/3852* (2013.01); *H03F 1/565* (2013.01); *H03F 3/08* (2013.01);
(Continued)

(58) Field of Classification Search
CPC . G01R 33/3852; G01R 33/3804; H03F 1/565; H03F 3/08; H03F 3/2173; H03F 3/2178; H03K 7/08; H03K 17/00
See application file for complete search history.

(56) References Cited

U.S. PATENT DOCUMENTS 5,027,071 A 6/1991 Hardy
6,671,329 B1 12/2003 Lenz
(Continued)

FOREIGN PATENT DOCUMENTS

DE 10044416 A1 4/2001
EP 2910965 A1 8/2015
(Continued)

OTHER PUBLICATIONS

European Search Report issued in connection with corresponding EP application No. 181930611, dated Apr. 17, 2019, 14 pages.
(Continued)

*Primary Examiner* — David M. Gray
*Assistant Examiner* — Michael A Harrison
(74) *Attorney, Agent, or Firm* — Armstrong Teasdale LLP

(57) ABSTRACT

A gradient amplifier for use in a MRI system can be located in the scan room. The gradient amplifier includes pair of rails connected to a gradient power supply. The gradient amplifier also includes a H-bridge of switches which includes a first high side switch and a first low side switch connected in series between the pair of rails, and a second high side switch and a second low side switch connected in series between the pair of rails. The gradient amplifier further includes a first high side driver circuit, a first low side driver circuit, a second high side driver circuit, and a second low side driver circuit, each configured to drive the corresponding switch in the H-bridge. A common power source supplies power to all driver circuits, wherein power is supplied to the high side driver circuits through bootstrap circuits.

17 Claims, 6 Drawing Sheets

(51) Int. Cl.
*H03F 1/56* (2006.01)
*H03K 7/08* (2006.01)
*H03F 3/08* (2006.01)
*H03K 17/00* (2006.01)
*G01R 33/38* (2006.01)

(52) U.S. Cl.
CPC ......... *H03F 3/2173* (2013.01); *H03F 3/2178* (2013.01); *H03K 7/08* (2013.01); *G01R 33/3804* (2013.01); *H03K 17/00* (2013.01)

(56) References Cited

U.S. PATENT DOCUMENTS

| | | | |
|---|---|---|---|
| 6,898,092 B2 | 5/2005 | Briere et al. | |
| 8,760,164 B2 | 6/2014 | Rivas Davila et al. | |
| 8,829,905 B2 | 9/2014 | Davila et al. | |
| 9,287,795 B2 | 3/2016 | Ma et al. | |
| 9,322,890 B2 | 4/2016 | Xu et al. | |
| 9,425,700 B2 | 8/2016 | Lu et al. | |
| 2013/0300417 A1 | 11/2013 | Malaney et al. | |
| 2014/0077812 A1 | 3/2014 | Sabate | |
| 2015/0177345 A1 | 6/2015 | Ham | |
| 2015/0234021 A1* | 8/2015 | Yu ..................... | G01R 33/3852 342/322 |
| 2016/0322155 A1 | 11/2016 | Bailey et al. | |

FOREIGN PATENT DOCUMENTS

| | | |
|---|---|---|
| WO | 2016040596 A1 | 3/2016 |
| WO | 2016050800 A2 | 4/2016 |
| WO | 2016057804 A1 | 4/2016 |
| WO | 2016069555 A1 | 5/2016 |

OTHER PUBLICATIONS

Ryan Schnell: Powering the Isolated Side of Your Half-Bridge Configuration11 , Technical Article MS-2663-1, Jan. 1, 2014 (Jan. 1, 2014), pp. 1-4, XP055579219, Retrieved from the Internet: URL:https://www.analog.com/media/en/techni cal-documentation/tech-articles/Powering-the-Isolated-Side-of-Your-Half-Bridge-Confi guration-MS-2663-1.pdf [retrieved on Apr. 9, 2019], whole document, in particular section Half-bridge bootstrap configuration*; figure 4 *.

Sabate Juan A et al: "Magnetic Resonance Imaging Power: High-Performance MVA Gradient Drivers", IEEE Journal of Emerging and Selected Topics in Power Electronics, IEEE, Piscataway, NJ, USA, vol. 4, No. 1, Mar. 1, 2016 (Mar. 1, 2016), pp. 280-292, XP011597309. ISSN: 2168-6777, DOI: 10.1109/JESTPE.2015. 2474714 [retrieved on Jan. 29, 2016].

* cited by examiner

MAGNETIC RESONANCE IMAGING GRADIENT DRIVER SYSTEMS AND METHODS

BACKGROUND

This disclosure relates to gradient driver systems used in magnetic resonance imaging (MRI) systems.

Generally, a MRI system includes a superconducting magnet that generates a relatively homogenous magnetic field, one or more gradient coils that generate magnetic gradients (e.g., linear gradients) to interact with the relatively homogenous magnetic field, and radio frequency (RF) coils that transmit RF excitation signals and receive resulting magnetic resonance (MR) signals. The gradients allow spatial encoding of the MR signals and are critical for a wide range of applications, such as MR angiography, diffusion, and perfusion imaging. A gradient driver is used in the MRI system for delivering a pulse sequence to the gradient coils. Currently, the gradient driver is located in an equipment room that is adjacent to and shielded from the scan room where the one or more gradient coils and rest of the MRI system are located. Long cables are used to electrically connect the gradient driver in the equipment room to the gradient coils located in the scan room. In addition, two sets of water cooling systems are used, one disposed in the equipment room for cooling the gradient driver, and the other disposed in the scan room for cooling the one or more gradient coils and other MRI system components.

SUMMARY

In one embodiment, the present disclosure provides a gradient driver system for use in a magnetic resonance imaging system. The gradient driver system comprises a gradient power supply, at least one gradient amplifier each configured to convert power from the gradient power supply to excite a corresponding gradient coil, and a gradient amplifier controller configured to control operation of the at least one gradient amplifier. Each of the at least one gradient amplifier comprises a pair of rails coupled to the gradient power supply, a H-bridge of switches, a gate driver circuit, and a gate driver power source. The H-bridge comprises a first high side switch and a first low side switch connected in series between the pair of rails, and a second high side switch and a second low side switch connected in series between the pair of rails. The gate driver circuit comprises a first high side driver circuit configured to drive the first high side switch, a first low side driver circuit configured to drive the first low side switch, a second high side driver circuit configured to drive the second high side switch; and a second low side driver circuit configured to drive the second low side switch. The gate driver power source is configured to supply power to the first high side driver circuit, the first low side driver circuit, the second high side driver circuit, and the second low side driver circuit, wherein power is supplied to the first high side driver circuit through a first bootstrap circuit and to the second high side driver circuit through a second bootstrap circuit.

In another embodiment, the present disclosure provides a gradient amplifier for use in an MRI system, the gradient amplifier comprising a pair of rails configured to carry a voltage of a gradient power supply, a H-bridge of switches, a gate driver circuit, and a gate drive power source. The H-bridge of switches comprises a first high side switch and a first low side switch connected in series between the pair of rails, and a second high side switch and a second low side switch connected in series between the pair of rails. The gate driver circuit comprises a first high side driver circuit configured to drive the first high side switch, a first low side driver circuit configured to drive the first low side switch, a second high side driver circuit configured to drive the second high side switch, and a second low side driver circuit configured to drive the second low side switch. The gate driver power source is configured to supply power to the first high side driver circuit, the first low side driver circuit, the second high side driver circuit, and the second low side driver circuit, wherein power is supplied to the first high side driver circuit through a first bootstrap circuit and to the second high side driver circuit through a second bootstrap circuit.

In yet another embodiment, the present disclosure provides a method for producing magnetic field gradient for use in a MRI system, the method comprising providing a gradient amplifier. The gradient amplifier comprises a pair of rails configured to carry a voltage of a gradient power supply, a H-bridge of switches comprising a first high side switch and a first low side switch connected in series between the pair of rails, and a second high side switch and a second low side switch connected in series between the pair of rails, and a gate driver circuit comprising a first high side driver circuit connected to the first high side switch, a first low side driver circuit connected to the first low side switch, a second high side driver circuit connected to the second high side switch; and a second low side driver circuit connected to the second low side switch. The method also comprises using a common power source to supply power to the first high side driver circuit, the first low side driver circuit, the second high side driver circuit, and the low side driver circuit, wherein power is supplied to the first high side driver circuit through a first bootstrap circuit and to the second high side driver circuit through a second bootstrap circuit. The method further comprises driving the first high side switch by using the first high side driver circuit, the first low side switch by the first low side driver circuit, the second high side switch by the second high side driver circuit, and the second low side switch by the second low side driver circuit, and converting, by the H-bridge of switches, power from the gradient power supply to excite a corresponding gradient coil.

BRIEF DESCRIPTION OF THE DRAWINGS

Various aspects of this disclosure may be better understood upon reading the following detailed description and upon reference to the drawings in which.

Figure 1:
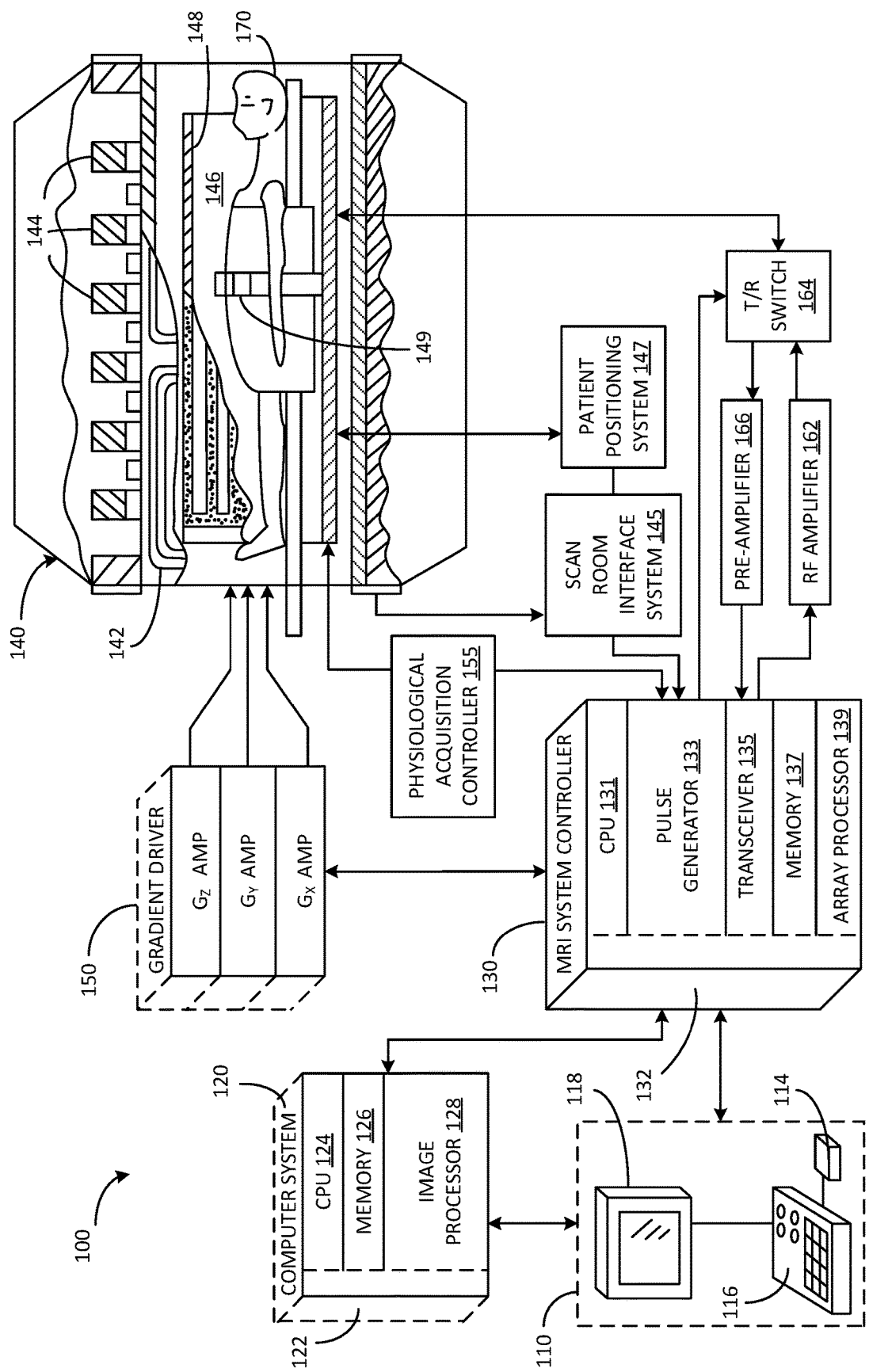
FIG. 1 is a schematic diagram of a MRI system, in accordance with an exemplary embodiment.

The drawings illustrate specific aspects of the described components, systems and methods for a gradient driver used in MRI systems. Together with the following description, the drawings demonstrate and explain the principles of the structures, methods, and principles described herein. In the drawings, the thickness and size of components may be exaggerated or otherwise modified for clarity. Well-known structures, materials, or operations are not shown or described in detail to avoid obscuring aspects of the described components, systems and methods.

DETAILED DESCRIPTION

One or more specific embodiments of the present disclosure are described below in order to provide a thorough understanding. These described embodiments are only examples of the systems and methods for a gradient driver. The skilled artisan will understand that specific details described in the embodiments can be modified when being placed into practice without deviating the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

Referring to the figures generally, the present disclosure is to locate a gradient amplifier in the scan room so that the gradient amplifier may be as close to the gradient coils as possible and the cable used to connect the gradient amplifier to the gradient coils can be as short as possible. In addition, one water cooling system, rather than two water cooling systems in conventional MRI system, can be used to cool the gradient amplifier and gradient coils. In particular, one or more gradient amplifiers are used for converting power from a gradient power supply to excite corresponding gradient coils. Each gradient amplifier includes a H-bridge of switching elements (e.g., semiconductor switches), wherein the on/off states of the switching elements are controlled by pulse width modulation (PWM). Switching noises (e.g., electromagnetic interference (EMI)) generated by PWM gradient amplifiers placed in the scan room, may affect the MRI functioning. In this disclosure, various measures are taken to isolate the switching noises and to prevent the MRI functioning frequency interference. For example, in the gate driver circuit that drives switches in the H-bridge, optocouplers are used to isolate the PWM signals. All gate drivers share a common power source, wherein power is supplied to high side drivers through a bootstrap circuit. Thus, components containing ferromagnetic materials are eliminated from the gradient amplifier and gate driver circuit.

In addition, a metal container is used to enclose the gradient amplifier so that EMI can be shielded from other in scan room MRI system components. Shielded cables are used to connect the gradient amplifier located in the scan room to the gradient power supply located in the equipment room. In some embodiments, an output filter is used to filter the output from the gradient amplifier to the gradient coils in order to reduce ripple current and EMI in the gradient amplifier output current. The output filter uses inductors with an air core to eliminate the use of ferromagnetic material.

Referring to FIG. 1, a schematic diagram of an exemplary MRI system 100 is shown in accordance with an embodiment. The operation of MRI system 100 is controlled from an operator workstation 110 that includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The components of the computer system 120 include a central processing unit (CPU) 124, a memory 126, which may include a frame buffer for storing image data, and an image processor 128. In an alternative embodiment, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The components of the MRI system controller 130 include a CPU 131, a pulse generator 133, which is coupled to and communicates with the operator workstation 110, a transceiver 135, a memory 137, and an array processor 139. In an alternative embodiment, the pulse generator 133 may be integrated into a resonance assembly 140 of the MRI system 100. The MRI system controller 130 is coupled to and receives commands from the operator workstation 110 to indicate the MRI scan sequence to be performed during a MRI scan. The MRI system controller 130 is also coupled to and communicates with a gradient driver system 150, which is coupled to a gradient coil assembly 142 to produce magnetic field gradients during a MRI scan.

The pulse generator 133 may also receive data from a physiological acquisition controller 155 that receives signals from a plurality of different sensors connected to an object or patient 170 undergoing a MRI scan, such as electrocardiography (ECG) signals from electrodes attached to the patient. And finally, the pulse generator 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a patient table to a desired position for a MRI scan.

The MRI system controller 130 provides gradient waveforms to the gradient driver system 150, which includes, among others, $G_X$, $G_Y$ and $G_Z$ amplifiers. Each $G_X$, $G_Y$ and $G_Z$ gradient amplifier excites a corresponding gradient coil in the gradient coil assembly 142 to produce magnetic field gradients used for spatially encoding MR signals during a MRI scan. The gradient coil assembly 142 is included within the resonance assembly 140, which also includes a superconducting magnet having superconducting coils 144, which in operation, provides a homogenous longitudinal magnetic field $B_0$ throughout an open cylindrical imaging volume 146 that is enclosed by the resonance assembly 140. The resonance assembly 140 also includes a RF body coil 148 which in operation, provides a transverse magnetic field $B_1$ that is generally perpendicular to $B_0$ throughout the open cylindrical imaging volume 146. The resonance assembly 140 may also include RF surface coils 149 used for imaging different anatomies of a patient undergoing a MRI scan. The RF body coil 148 and RF surface coils 149 may be configured to operate in a transmit and receive mode, transmit mode, or receive mode.

An object or patient 170 undergoing a MRI scan may be positioned within the open cylindrical imaging volume 146 of the resonance assembly 140. The transceiver 135 in the MRI system controller 130 produces RF excitation pulses that are amplified by an RF amplifier 162 and provided to the RF body coil 148 and RF surface coils 149 through a transmit/receive switch (T/R switch) 164.

As mentioned above, RF body coil 148 and RF surface coils 149 may be used to transmit RF excitation pulses and/or to receive resulting MR signals from a patient undergoing a MRI scan. The resulting MR signals emitted by excited nuclei in the patient undergoing a MRI scan may be sensed and received by the RF body coil 148 or RF surface coils 149 and sent back through the T/R switch 164 to a pre-amplifier 166. The amplified MR signals are demodulated, filtered and digitized in the receiver section of the transceiver 135. The T/R switch 164 is controlled by a signal from the pulse generator 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

The resulting MR signals sensed and received by the RF body coil 148 are digitized by the transceiver 135 and transferred to the memory 137 in the MRI system controller 130.

A MR scan is complete when an array of raw k-space data, corresponding to the received MR signals, has been acquired and stored temporarily in the memory 137 until the data is subsequently transformed to create images. This raw k-space data is rearranged into separate k-space data arrays for each image to be reconstructed, and each of these separate k-space data arrays is input to the array processor 139, which operates to Fourier transform the data into arrays of image data.

The array processor 139 uses a known transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems.

Figure 2:
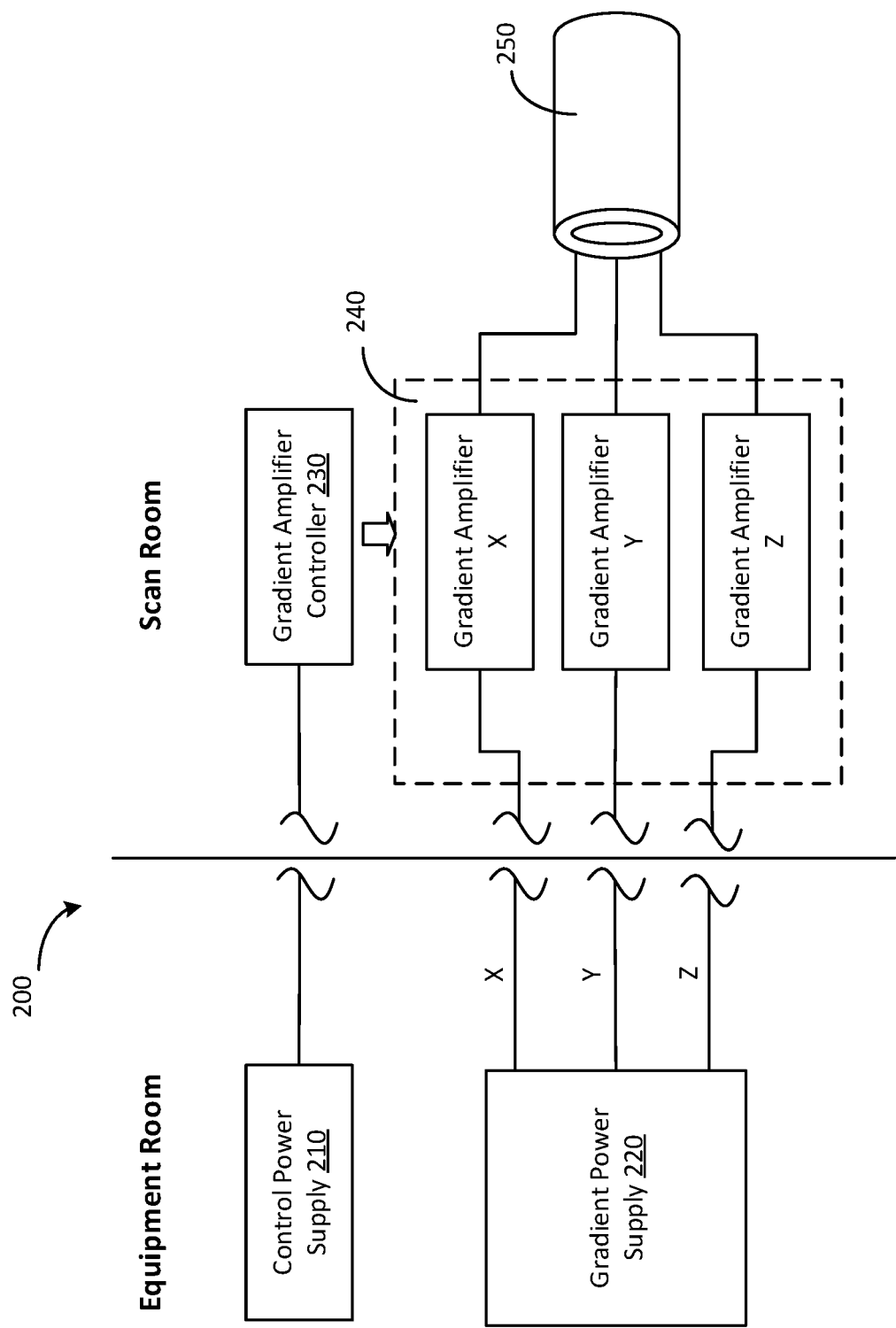
FIG. 2 is a schematic diagram of a gradient driver system that can be used in the MRI system of FIG. 1, in accordance with an exemplary embodiment.

Referring to FIG. 2, a schematic diagram of a gradient driver system 200 is shown in accordance with an exemplary embodiment. The gradient driver system 200 can be used as the gradient driver system 150 in the MRI system 100 shown in FIG. 1. As illustrated in FIG. 2, in some embodiments, the gradient driver system 200 includes a control power supply 210, a gradient power supply 220, a gradient amplifier controller 230, and a gradient amplifier assembly 240. The gradient amplifier assembly 240 is configured to excite a gradient coil assembly 250 (which corresponds to the gradient coil assembly 142 of FIG. 1) by using power from the gradient power supply 220 under the control of the gradient amplifier controller 230. The control power supply 210 supplies power to the gradient amplifier controller 230. In some embodiments, the gradient amplifier assembly 240 includes three gradient amplifiers X, Y, and Z, each coupled to a corresponding gradient coil in the gradient coil assembly 250 and configured to excite the corresponding gradient coil.

The control power supply 210 and the gradient power supply 220 are located within an equipment room, while the gradient amplifier controller 230 and the gradient amplifier assembly 240 are located within a scan room. Components of a MRI system are located in separate rooms to avoid interferences. The scan room contains the superconducting magnet, gradient coils, RF coils, and the table for holding the object to be scanned.

The equipment room is located immediately adjacent to the scan room and contains computers, RF amplifiers, power supplies, and other equipment that controls the MRI scanner. The walls of the scan room are constructed in layers and perform several functions including magnetic shielding, acoustic shielding, and RF shielding. In some embodiments, the gradient amplifier assembly 240 and the gradient amplifier controller 230 are located near the superconducting magnet (e.g., superconducting coils 144 of FIG. 1).

Different cooling systems cool the scan room and the equipment room. In the conventional configuration, wherein the gradient amplifier assembly is located in the equipment room, one water cooling system is disposed in the scan room for cooling the gradient amplifier, and another water cooling system is disposed in the scan room for cooling the gradient coils. In the MRI system disclosed herein, by contrast, only one water cooling system is used to cool the gradient amplifier and the gradient coils.

In some embodiments, the gradient power supply 220 includes a series resonant converter that is operated to convert an input power (e.g., a three-phase alternating current power from a power grid) to three direct current (DC) power outputs, i.e., DC power X, DC power Y, and DC power Z. Each of the DC power outputs X, Y, and Z is linked separately with the corresponding gradient amplifier X, Y, or Z of the gradient amplifier assembly 240.

The gradient amplifier assembly 240 uses power from the gradient power supply 220 to excite the gradient coil assembly 250, which in turn produces magnetic field gradients. As illustrated in FIG. 2, in some embodiments, the gradient amplifier assembly 240 includes three gradient amplifiers X, Y, and Z, each supplying controllable electrical power to a corresponding gradient coil of the gradient coil assembly 250. The gradient coils surround an object, for example a patient, and generate time-varying magnetic field gradients along X, Y, and Z directions. In some embodiments, each of gradient amplifiers X, Y, and Z includes an array of switching elements. Structure of the gradient amplifier will be discussed in detail with reference to FIG. 3.

The gradient amplifier controller 230 controls the operation of the gradient amplifiers X, Y, and Z by controlling, for example, the on/off states of the switching elements of each gradient amplifier. The gradient amplifier controller 230 is coupled to and receives gradient waveforms (e.g., gradient pulse sequence) from a MRI system controller (e.g., MRI system controller 130 of FIG. 1). The gradient waveforms can drive time-varying magnetic field gradients. Based on the gradient waveforms, the gradient amplifier controller 230 generates amplifier control signals, and sends the amplifier control signals to the gradient amplifier assembly 240.

The control power supply 210 supplies power to the gradient amplifier controller 230 for its operation. In some embodiments, the control power supply 210 is operated to convert an input power (e.g., a three-phase AC power from a power grid) to a DC power output.

Figure 3A:
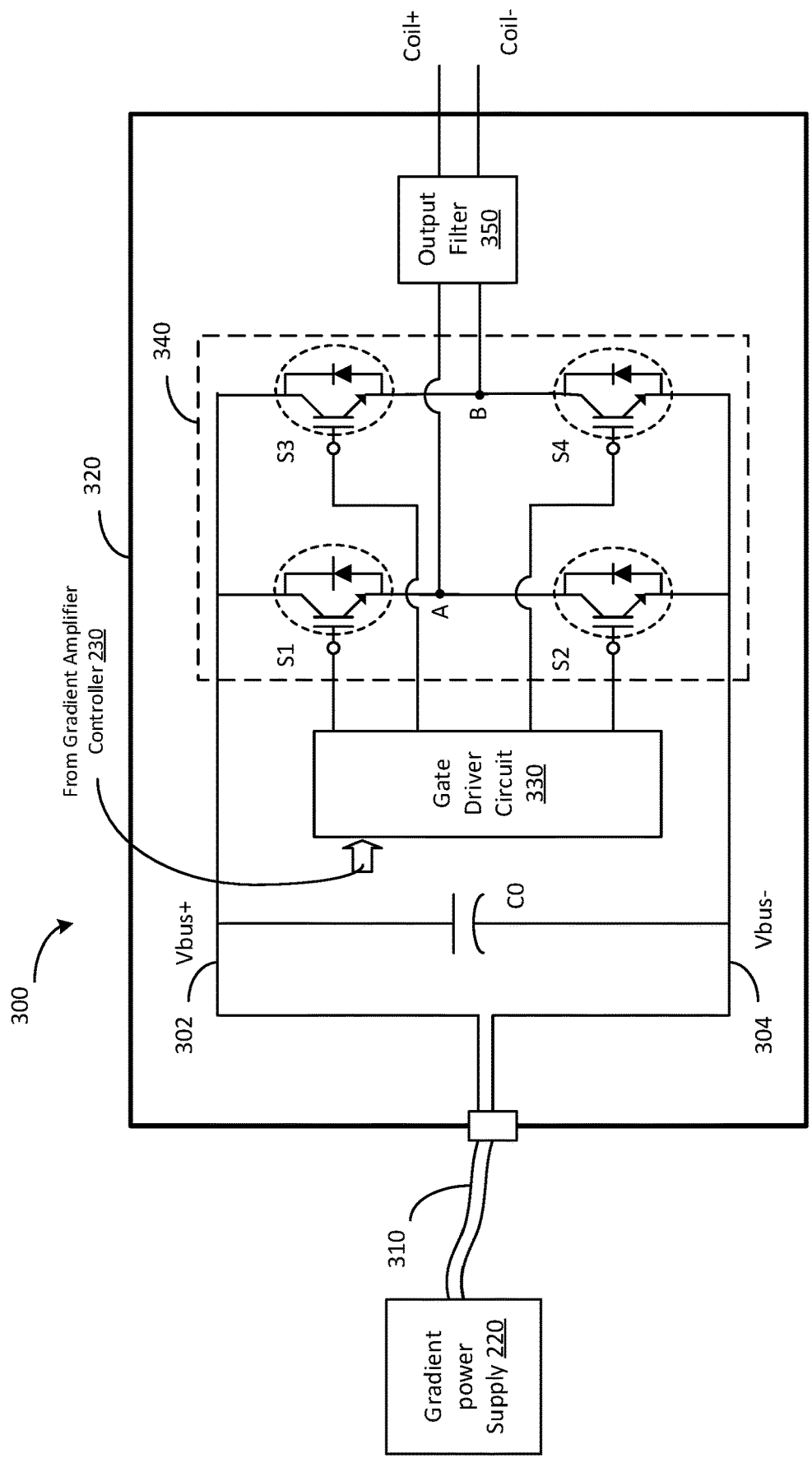
FIG. 3A is a schematic diagram of a gradient amplifier assembly that can be used in the gradient driver of FIG. 2, in accordance with an exemplary embodiment.

Referring to FIG. 3A, a schematic diagram of a gradient amplifier 300 is shown in accordance with an exemplary embodiment. The gradient amplifier 300 can be used as each of the gradient amplifiers X, Y, and Z in the gradient amplifier assembly 240 shown in FIG. 2. As illustrated in FIG. 3, in some embodiments, the gradient amplifier includes a Faraday shield 320 housing switching elements S1, S2, S3, and S4, and other components. As discussed above, the gradient amplifier is located within the scan room. Switching noises generated by switching elements S1, S2, S3, and S4 need to be isolated from the magnets to avoid MRI functioning frequency interference. In some embodiments, the Faraday shield 320 includes a metal container to shield EMI from other in scan room MRI system components.

In some embodiments, the gradient amplifier 300 is connected to the gradient power supply (e.g., gradient power supply 220 of FIG. 2) through a shielded cable 310. The shielded cable 310 connects the gradient power supply in the equipment room to the gradient amplifier 300 in the scan room. Because a magnetic field is generated when electrical current flows through electrically conductive material, a cable in the scan room may generate an additional magnetic field that may potentially interfere with the magnetic field generated by the superconducting magnet of the MRI system.

Figure 3B:
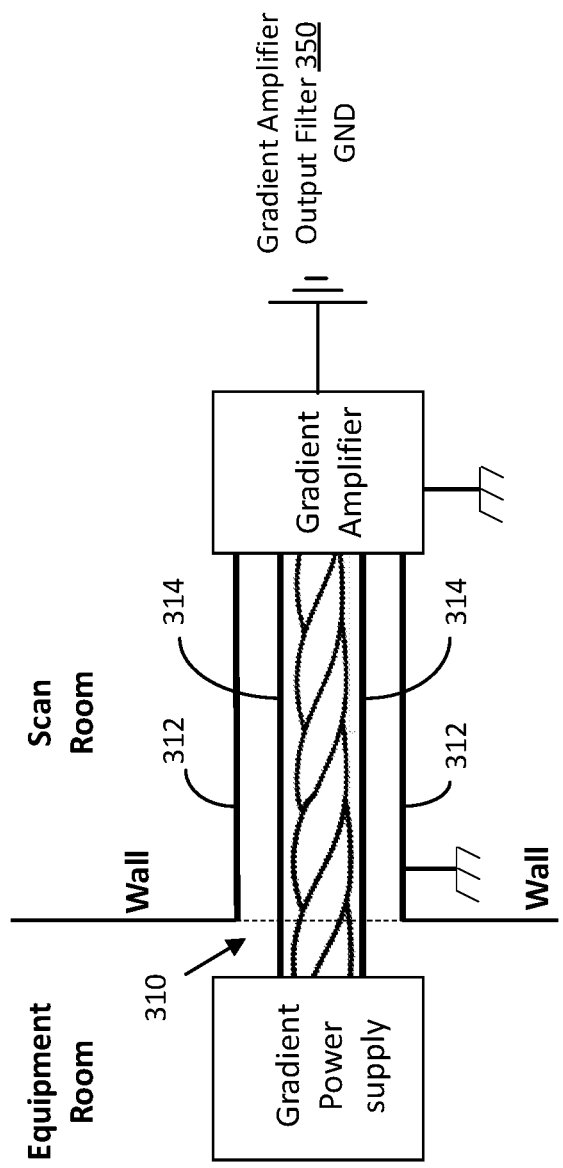
FIG. 3B is a schematic diagram of a shielded cable, in accordance with an exemplary embodiment.

FIG. 3B shows a schematic diagram of the shielded cable 310 in accordance with an exemplary embodiment. In some embodiments, as illustrated in FIG. 3B, the shielded cable 310 has at least two layers of metal shielding, 312 and 314, to eliminate common mode currents and EMI. The cable 310 has a first layer of metal shielding 314 (i.e., the inner layer) that is connected to ground of the gradient amplifier output filter 350 to eliminate common mode currents, and a second layer of metal shielding 312 (i.e., the outer layer) that is connected to an earth ground connection in the scan room to eliminate EMI from the cable. In some embodiments, the shielded cable 310 may include more than two layers of metal shielding if needed.

Referring back to FIG. 3A, the DC voltage from the gradient power supply 220 is applied on a pair of rails 302 (Vbus+) and 304 (Vbus−). The DC voltage is stored in a capacitor C0, converted by a single H-bridge inverter 340, and then output to the corresponding gradient coil through an output filter 350. In some embodiments, pulse width modulation (PWM) is used to convert the DC voltage. In particular, a gate driver circuit 330 receives the PWM signals from the gate amplifier controller 230 and controls switches S1, S2, S3, and S4 in accordance with the PWM signals.

Switching elements S1, S2, S3, and S4 form the single H-bridge 340, which can decrease power loss and facilitate EMI elimination compared to linear elements. S1 and S2 are connected in series between the pair of rails 302 and 304, forming the first leg of the H-bridge 340. S3 and S4 are connected in series between the pair of rails 302 and 304, forming the second leg of the H-bridge 340. Because S1 and S3 are connected to the high side of the DC voltage (i.e., Vbus+), S1 is called the first high side switch and S3 is called the second high side switch. Because S2 and S4 are connected to the low side of the DC voltage (i.e., Vbus−), S2 is called the first low side switch and S4 is called the second low side switch. The node A between S1 and S2 and the node B between S3 and S4 are connected to a gradient coil through output filter 350 to provide power to the gradient coil.

The switching elements S1 through S4 can be silicon (Si) transistors or silicon carbide (SiC) transistors, such as metal-oxide-semiconductor field-effect transistors (MOSFETs) or insulated-gate bipolar transistors (IGBTs). In some embodiments, the new wide band gap SiC MOSFETs are used to enable faster switching and to reduce switching loss. It should be understood that although the switching elements are presently discussed as being MOSFETs, the associated descriptions are intended to compass all variations in material or configuration including, but not limited to, MOSFETs and IGBTs. The gate driver circuit 330 is configured to control the on/off states of S1 through S4 by using PWM signals received from the gradient amplifier controller (e.g., gradient amplifier controller 230 of FIG. 2). Structure of the gate driver circuit 330 will be discussed in detail below with reference to FIG. 4.

As illustrated by FIG. 3A, in some embodiments, an output filter 350 is used to reduce ripple current and EMI caused by the switching elements S1 through S4. In some embodiments, the output filter 350 includes two stages of filters—a differential mode filter for reducing the ripple current and a common mode filter for reducing EMI. In some embodiments, the output filter 350 employs only energy storage components (e.g., capacitors and inductors) that are devoid of ferromagnetic materials. Inductors employed in conventional filters are usually constructed of a high permeability ferromagnetic material (e.g., ferrite). The large DC magnetic field in the vicinity of the superconducting magnet can saturate the ferromagnetic material. In this disclosure, by contrast, inductors with a non-magnetic core (e.g., air core) are used in the output filter 350, which are not subject to saturation and thus can be located within the MR main magnetic field in the scan room.

Figure 4:
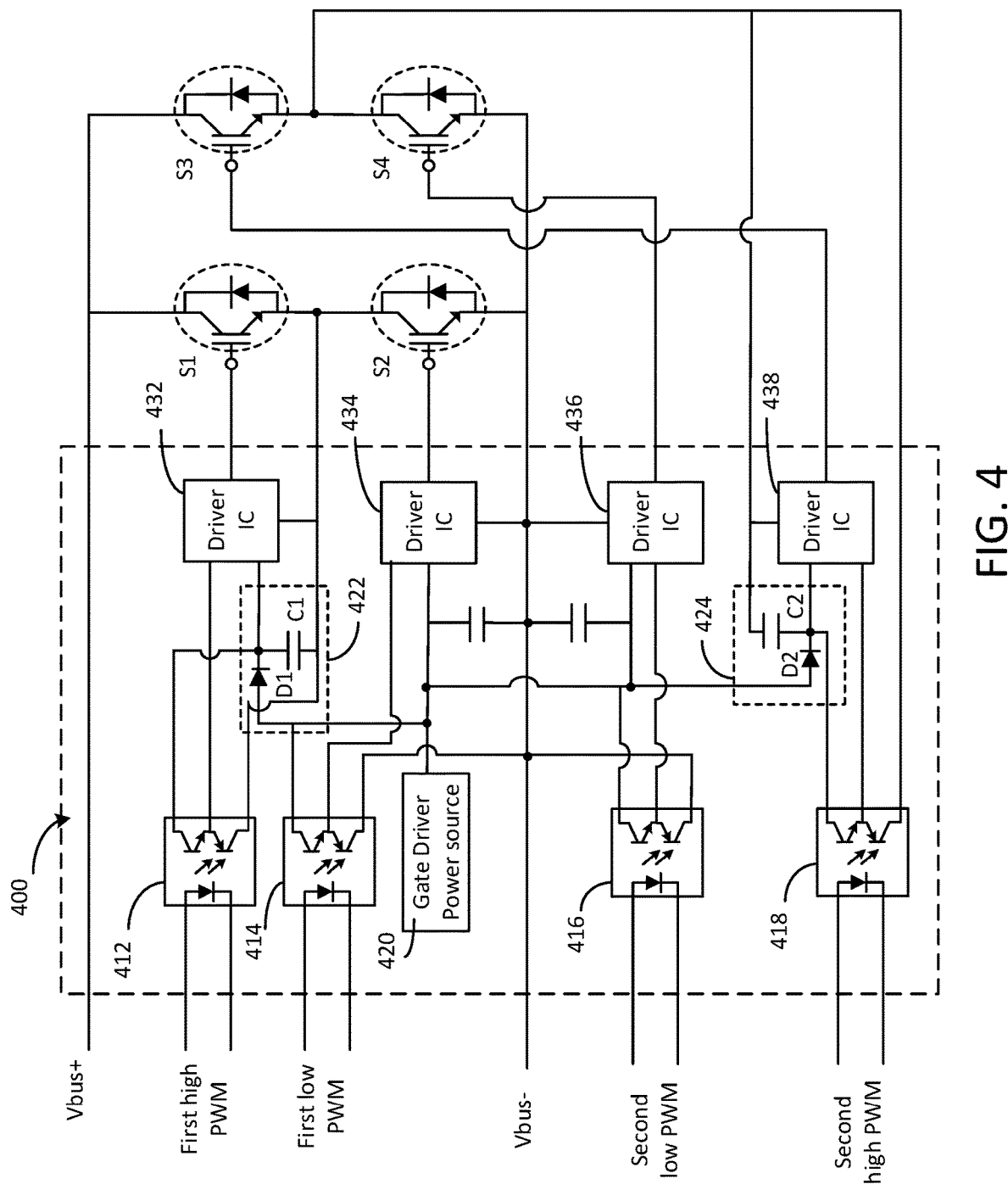
FIG. 4 is a schematic diagram of a gate driver circuit that can be used in the gradient amplifier assembly of FIG. 3A, in accordance with an exemplary embodiment.

Referring to FIG. 4, a schematic diagram of a gate driver circuit 400 is shown in accordance with an exemplary embodiment. The gate driver circuit 400 can be used as the gate driver circuit 330 shown in FIG. 3A. As illustrated in FIG. 4, in some embodiments, the gate driver circuit 400 includes optocouplers 412, 414, 416, and 418 for isolating PWM signals received from the gradient amplifier controller (e.g., gradient amplifier controller 230 of FIG. 2), driver circuits (e.g., integrated circuits (ICs)) 432, 434, 436, and 438 for driving switching elements S1, S2, S3, and S4, respectively. A gate driver power source 420 supplies DC power to driver ICs 432, 434, 436, and 438. Ferromagnetic material can be eliminated from the gate driver circuit 400 when the driver ICs 432 through 438 share a common DC power source.

In operation, the first high side optocoupler 412 isolates the first high side PWM signals received from the gradient amplifier controller. The isolated first high side PWM signals control the on/off state of the first high side switch Si through the first high side driver IC 432. In particular, the first high side driver IC 432 translates the first high side PWM signals to high/low voltages accordingly in order to switch the gate of the first high side switch S1. The first low side optocoupler 414 isolates the first low side PWM signals received from the gradient amplifier controller. The isolated first low side PWM signals control the on/off state of the first low side switch S2 through the first low side driver IC 434. In particular, the first low side driver IC 434 translates the first low side PWM signals to high/low voltages accordingly in order to switch the gate of the first low side switch S2. The second high side components (second high side optocoupler 418, second high side driver IC 438, second high side switch S3) and second low side components (second low side optocoupler 416, second low side driver IC 436, second low side switch S4) operate in a similar way like their counterparts on the first high side and first low side.

In some embodiments, the gate driver power source 420 supplies DC power to the low side driver ICs 434 and 436 directly, while the gate driver power source 420 supplies power to the high side driver ICs 432 and 438 through bootstrap circuits 422 and 424, respectively. The first bootstrap circuit 422 includes a diode D1 and a capacitor C1 for energy storage. In operation, during switching of the first low side switch S2, the capacitor C1 is charged by the gate driver power source 420. The energy stored in the capacitor C1 provides DC power to the first high side driver IC 434 for driving the first high side switch S1. The second bootstrap circuit 424 includes a diode D2 and a capacitor C2 for energy storage. In operation, during switching of the second low side switch S4, the capacitor C2 is charged by the gate driver power source 420. The energy stored in the capacitor C2 provide DC power to the second high side driver IC 438 for driving the second high side switch S3.

Figure 5:
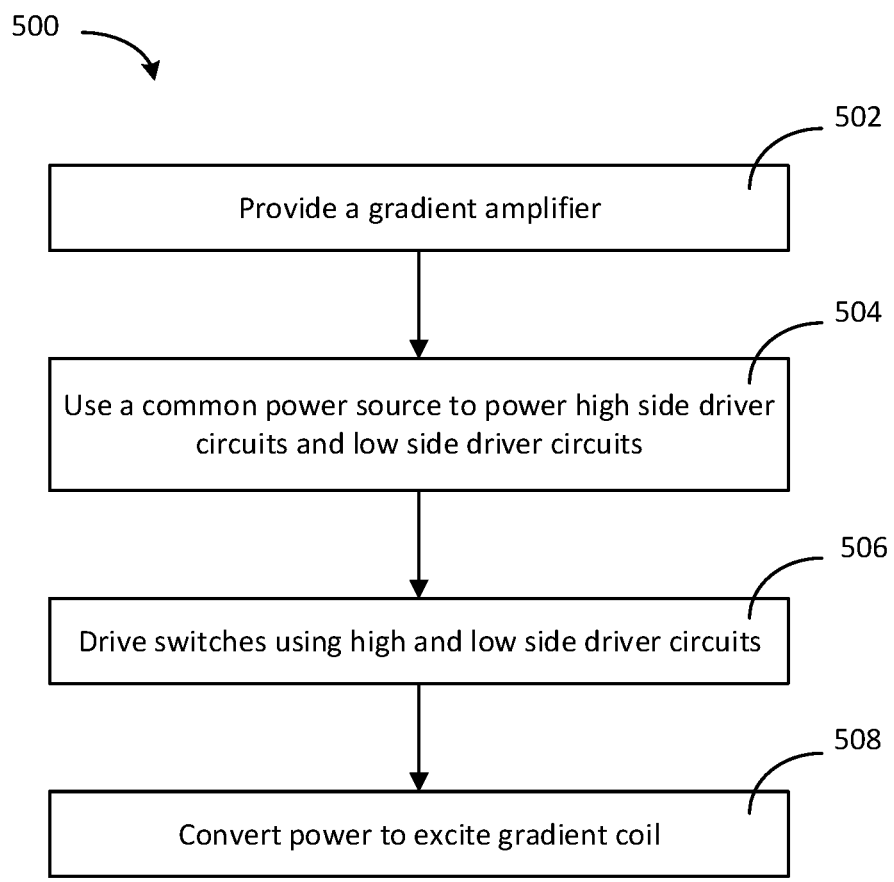
FIG. 5 is a flow chart of a method for producing magnetic field gradient for use in the MRI system of FIG. 1, in accordance with an exemplary embodiment.

Referring to FIG. 5, a flow chart 500 of a method for producing magnetic field gradients for use in a MRI system is shown in accordance with an exemplary embodiment. At an operation 502, a gradient amplifier is provided in the scan room of an MRI system. The gradient amplifier may have the same structure as the gradient amplifier 300 shown in FIG. 3. In some embodiments, the gradient amplifier comprises a pair of rails configured to carry a voltage of a gradient power supply, a H-bridge of switches, and a gate driver circuit. The H-bridge of switches comprises a first high side switch and a first low side switch connected in series between the pair of rails, and a second high side switch and a second low side switch connected in series between the pair of rails. The gate driver circuit comprises a first high side driver circuit connected to the first high side switch, a first low side driver circuit connected to the first low side switch, a second high side driver circuit connected to the second high side switch, and a second low side driver circuit connected to the second low side switch.

At an operation 504, a common power source is used to supply power to the first high side driver circuit, the first low side driver circuit, the second high side driver circuit, and the second low side driver circuit. Power is supplied to the first high side driver circuit through a first bootstrap circuit and to the second high side driver circuit through a second bootstrap circuit. The first bootstrap circuit and the second bootstrap circuit may have the same structure as the bootstrap circuits 422 and 424 as shown in FIG. 4.

At an operation 506, switches in the H-bridge are driven by the gate driver circuit. In particular, the first high side switch is driven by using the first high side driver circuit, the first low side switch by the first low side driver circuit, the second high side switch by the second high side driver circuit, and the second low side switch by the second low side driver circuit.

At an operation 508, power is converted, by the H-bridge of switches, from the gradient power supply to excite a corresponding gradient coil.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

What is claimed is:

1. A gradient driver system for use in a magnetic resonance imaging system, the gradient driver system comprising:
   a gradient power supply;
   at least one gradient amplifier each configured to convert power from the gradient power supply to excite a corresponding gradient coil, wherein the at least one gradient amplifier is located in a scan room, each of the at least one gradient amplifier comprising:
      a pair of rails coupled to the gradient power supply;
      a H-bridge of switches comprising a first high side switch and a first low side switch connected in series between the pair of rails, and a second high side switch and a second low side switch connected in series between the pair of rails;
      a gate driver circuit comprising a first high side driver circuit configured to drive the first high side switch, a first low side driver circuit configured to drive the first low side switch, a second high side driver circuit configured to drive the second high side switch; and a second low side driver circuit configured to drive the second low side switch; and
      a gate driver power source configured to supply power to the first high side driver circuit, the first low side driver circuit, the second high side driver circuit, and the second low side driver circuit, wherein power is supplied to the first high side driver circuit through a first bootstrap circuit and to the second high side driver circuit through a second bootstrap circuit; and
   a gradient amplifier controller configured to control operation of the at least one gradient amplifier.

2. The gradient driver system of claim 1, wherein the at least one gradient amplifier is located near a superconducting magnet in the scan room.

3. The gradient driver system of claim 1, wherein the at least one gradient amplifier is enclosed in a metal shield.

4. The gradient driver system of claim 1, wherein the pair of rails is connected to the gradient power supply through a shielded cable, wherein the shielded cable includes at least two layers of metal shielding.

5. The gradient driver system of claim 1, wherein each of the at least one gradient amplifier further comprises an output filter configured to filter an output to the corresponding gradient coil, and the output filter comprises at least an inductor with an air core.

6. The gradient driver system of claim 1, wherein the at least one gradient amplifier is devoid of ferromagnetic material.

7. The gradient driver system of claim 1, wherein the first high side switch, the first low side switch, the second high side switch, and the second low side switch are silicon carbide (SiC) metal-oxide-semiconductor field-effect transistors (MOSFETs).

8. The gradient driver system of claim 1, wherein the first bootstrap circuit includes a first diode and a first capacitor, the first capacitor is charged during switching of the first low side switch; and the second bootstrap circuit includes a second diode and a second capacitor, and the second capacitor is charged during switching of the second low side switch.

9. A gradient amplifier for use in an MM system, the gradient amplifier comprising:
a pair of rails configured to carry a voltage of a gradient power supply;
a H-bridge of switches comprising a first high side switch and a first low side switch connected in series between the pair of rails, and a second high side switch and a second low side switch connected in series between the pair of rails;
a gate driver circuit comprising a first high side driver circuit configured to drive the first high side switch, a first low side driver circuit configured to drive the first low side switch, a second high side driver circuit configured to drive the second high side switch, and a second low side driver circuit configured to drive the second low side switch;
a gate driver power source configured to supply power to the first high side driver circuit, the first low side driver circuit, the second high side driver circuit, and the second low side driver circuit, wherein power is supplied to the first high side driver circuit through a first bootstrap circuit and to the second high side driver circuit through a second bootstrap circuit; and
a metal shield enclosing the H-bridge of switches, the gate driver circuit, and the gate driver power source.

10. The gradient amplifier of claim 9, further comprising:
a first high side optocoupler connected to the first high side driver circuit and configured to isolate pulse width modulation (PWM) signals for the first high side switch;
a first low side optocoupler connected to the first low side driver circuit and configured to isolate PWM signals for the first low side switch;
a second high side optocoupler connected to the second high side driver circuit and configured to isolate PWM signals for the second high side switch; and
a second low side optocoupler connected to the second low side driver circuit and configured to isolate PWM signals for the second low side switch.

11. The gradient amplifier of claim 9, wherein the gradient amplifier is located in a scan room.

12. The gradient amplifier of claim 9, further comprising an output filter configured to filter an output to the corresponding gradient coil, and the output filter comprises at least an inductor with an air core.

13. The gradient amplifier of claim 9, wherein the first bootstrap circuit includes a first diode and a first capacitor, the first capacitor is charged during switching of the first low side switch, and the second bootstrap circuit includes a second diode and a second capacitor, the second capacitor is charged during switching of the second low side switch.

14. A method for producing magnetic field gradient for use in a MRI system, the method comprising:
providing a gradient amplifier, the gradient amplifier comprising:
a pair of rails configured to carry a voltage of a gradient power supply;
a H-bridge of switches comprising a first high side switch and a first low side switch connected in series between the pair of rails, and a second high side switch and a second low side switch connected in series between the pair of rails;
and a gate driver circuit comprising a first high side driver circuit connected to the first high side switch, a first low side driver circuit connected to the first low side switch, a second high side driver circuit connected to the second high side switch; and a second low side driver circuit connected to the second low side switch;
locating the gradient amplifier in a scan room;
using a common power source to supply power to the first high side driver circuit, the first low side driver circuit, the second high side driver circuit, and the second low side driver circuit, wherein power is supplied to the first high side driver circuit through a first bootstrap circuit and to the second high side driver circuit through a second bootstrap circuit;
driving the first high side switch by using the first high side driver circuit, the first low side switch by the first low side driver circuit, the second high side switch by the second high side driver circuit, and the second low side switch by the second low side driver circuit;
converting, by the H-bridge of switches, power from the gradient power supply to excite a corresponding gradient coil; and
locating the gradient amplifier in a scan room.

15. The method of claim 14, further comprising enclosing the gradient amplifier in a metal shield.

16. The method of claim 14, further comprising connecting the pair of rails to the gradient power supply through a shielded cable, wherein the shielded cable includes at least two layers of metal shielding.

17. The method of claim 14, further comprising filtering, by an output filter, an output to the corresponding gradient coil, wherein the output filter comprises at least an inductor with an air core.

* * * * *